(12) United States Patent
Bower

(10) Patent No.: US 11,618,338 B2
(45) Date of Patent: Apr. 4, 2023

(54) SYSTEMS AND METHODS FOR MANAGING A NETWORK OF ELECTRIC AIRCRAFT BATTERIES

(71) Applicant: Archer Aviation, Inc., San Jose, CA (US)

(72) Inventor: Geoffrey C. Bower, Sunnyvale, CA (US)

(73) Assignee: Archer Aviation, Inc., San Jose, CA (US)

( * ) Notice: Subject to any disclaimer, the term of this patent is extended or adjusted under 35 U.S.C. 154(b) by 183 days.

(21) Appl. No.: 17/177,021

(22) Filed: Feb. 16, 2021

(65) Prior Publication Data

US 2022/0258645 A1 Aug. 18, 2022

(51) Int. Cl.
| | |
|---|---|
| *B60L 53/80* | (2019.01) |
| *G01R 31/392* | (2019.01) |
| *B64D 27/24* | (2006.01) |
| *B64F 5/60* | (2017.01) |
| *B60L 58/16* | (2019.01) |

(Continued)

(52) U.S. Cl.
CPC ............. *B60L 53/80* (2019.02); *B60L 3/0046* (2013.01); *B60L 58/16* (2019.02); *B64D 27/24* (2013.01); *B64F 5/60* (2017.01); *G01R 31/392* (2019.01); *B64C 29/0033* (2013.01)

(58) Field of Classification Search
CPC ........ B60L 53/80; B60L 3/0046; B60L 58/16; B60L 2200/10; B60L 2240/12; B60L 2240/18; B60L 2240/62; B60L 2240/622; B60L 2240/72; B60L 2250/14; B60L 53/62; B60L 53/63; B60L 53/66; B60L 53/67; B60L 58/12; B60L 53/305; B64D 27/24; B64D 9/00; B64F 5/60; B64F 1/362;

(Continued)

(56) References Cited

U.S. PATENT DOCUMENTS

| | | | |
|---|---|---|---|
| 6,459,175 B1 * | 10/2002 | Potega | H02J 7/00047 307/132 M |
| 8,018,079 B2 * | 9/2011 | Kelly | F03D 9/11 290/55 |

(Continued)

OTHER PUBLICATIONS

International Search Report and Written Opinion dated May 18, 2022, directed to International Application No. PCT/US2022/070658; 13 pages.

*Primary Examiner* — Tung S Lau
(74) *Attorney, Agent, or Firm* — Morrison & Foerster LLP

(57) ABSTRACT

A method for assigning swappable battery packs to electric aircraft includes receiving, at a computing system, status information for a plurality of battery packs located at at least one battery swapping location, wherein the status information comprises states of charge and states of health for the plurality of battery packs; determining, by the computing system, energy requirements for a plurality of electric aircraft based at least in part on flight plans for the plurality of electric aircraft; determining, by the computing system, assignments of at least a portion of the plurality of battery packs to the plurality of electric aircraft based at least in part on the states of charge and states of health of the plurality of battery packs and the energy requirements for the plurality of aircraft; and swapping at least one battery pack into at least one aircraft based on the determined assignments.

20 Claims, 12 Drawing Sheets

(51) Int. Cl.
*B60L 3/00* (2019.01)
*B64C 29/00* (2006.01)

(58) Field of Classification Search
CPC .............. G01R 31/392; G01R 31/3647; B64C 29/0033; Y02T 10/70; Y02T 50/60
See application file for complete search history.

(56) References Cited

U.S. PATENT DOCUMENTS

| | | | |
|---|---|---|---|
| 9,643,729 B2* | 5/2017 | Walter-Robinson | H02P 4/00 |
| 9,789,768 B1* | 10/2017 | Meier | B64C 35/00 |
| 10,380,900 B2* | 8/2019 | Batla | G08G 5/0039 |
| 2012/0049533 A1* | 3/2012 | Kelly | F03D 9/25 |
| | | | 290/55 |
| 2015/0021442 A1* | 1/2015 | Hunter | B64D 33/08 |
| | | | 244/53 R |
| 2015/0116345 A1* | 4/2015 | Shoup | G01C 23/00 |
| | | | 702/50 |
| 2018/0072414 A1* | 3/2018 | Cantrell | B64C 3/56 |
| 2018/0093768 A1* | 4/2018 | Castleman | B64C 39/024 |
| 2020/0350640 A1 | 11/2020 | Combs et al. | |
| 2022/0250755 A1* | 8/2022 | Hull | B64C 29/0016 |

* cited by examiner

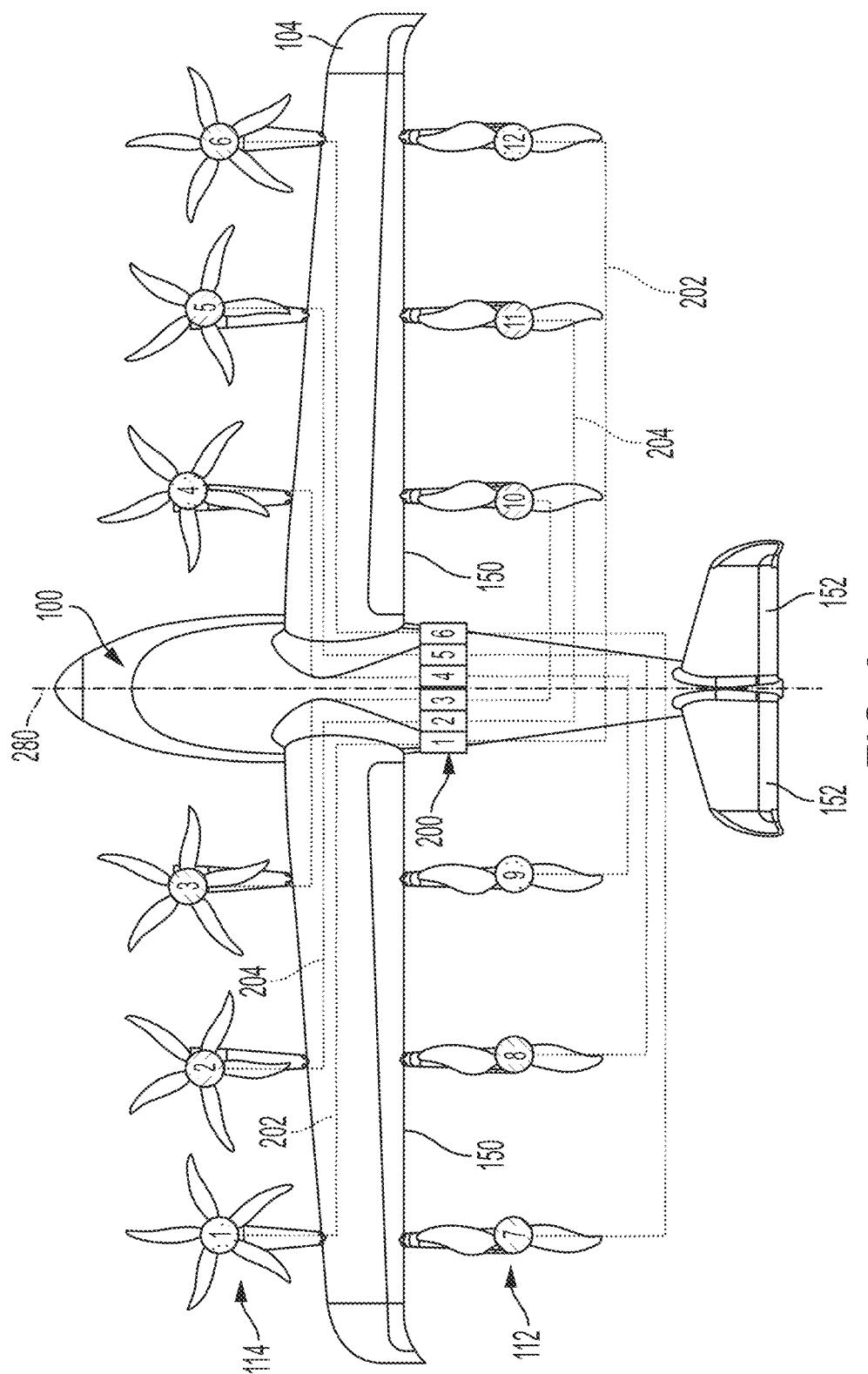

SYSTEMS AND METHODS FOR MANAGING A NETWORK OF ELECTRIC AIRCRAFT BATTERIES

FIELD

This disclosure relates generally to batteries for electric vehicles, and more specifically, to swappable batteries for electric aircraft.

BACKGROUND

Vertical take-off and landing (VTOL) aircraft are aircraft that can take-off and land vertically and hover, providing the ability to carry travelers directly to their destination. Electric VTOL (eVTOL) aircraft use electric propulsion units powered by a battery pack to provide thrust for vertical flight and forward flight. Operating costs for eVTOL aircraft are strongly affected by aircraft utilization. Rapid recharging of battery packs may be used to minimize aircraft downtime, increasing aircraft utilization, but rapid recharging can significantly degrade batteries over time. Even without rapid recharging, battery packs degrade over a number of cycles of discharging and recharging such that their maximum charge capacity decreases over time.

eVTOL aircraft and their battery packs may be sized to meet a maximum range of the eVTOL aircraft at the end-of-life state of the battery pack to ensure, for safety purposes, that any fully charged battery pack in operation can support a maximum flight range energy demand. As a result, battery packs for eVTOL aircraft may be oversized at the beginning of their life. This oversizing results in a heavier battery packs and heavier aircraft to support the heavier battery packs. Operating costs for eVTOL aircraft are also strongly affected by battery pack cost. Therefore, minimizing battery pack size while maximizing battery pack lifespan, along with maximizing aircraft utilization, is generally desirable.

SUMMARY

According to various embodiments, systems and methods can determine assignments of a plurality of swappable battery packs to electric aircraft based on energy demands of the aircraft for upcoming flights and based on statuses of the battery packs. The assignments may be determined based on states of charge of the battery packs as well as states of health of the battery packs such that battery packs with higher states of health are assigned to aircraft with higher energy demands (e.g., longer trips). By assigning battery packs based on the statuses of the battery packs and the energy demands of future flights, the aircraft and battery packs can be designed based on a higher state of health of the battery pack, which can enable the design of smaller battery packs and lighter aircraft. Further, battery packs with lower states of health may be assigned to lower energy demand flights, which may extend their useful life. Further, aircraft utilization can be maximized by ensuring that battery packs with sufficient charge are available for swapping into the aircraft.

According to various embodiments, a method for assigning swappable battery packs to electric aircraft includes receiving, at a computing system, status information for a plurality of battery packs located at at least one battery swapping location, wherein the status information comprises states of charge and states of health for the plurality of battery packs; determining, by the computing system, energy requirements for a plurality of electric aircraft based at least in part on flight plans for the plurality of electric aircraft; determining, by the computing system, assignments of at least a portion of the plurality of battery packs to the plurality of electric aircraft based at least in part on the states of charge and states of health of the plurality of battery packs and the energy requirements for the plurality of aircraft; and swapping at least one battery pack into at least one aircraft based on the determined assignments.

In any of these embodiments, determining the assignments may include assigning battery packs that have higher states of health to aircraft that have higher energy requirements.

In any of these embodiments, determining assignments may include identifying from among a plurality of the battery packs that are located at a first battery swapping location, multiple battery packs that have sufficient charge to meet energy requirements of a first aircraft that requires battery swapping at the first battery swapping location, and selecting, from among the multiple battery packs that have sufficient charge to meet energy requirements of the first aircraft, a first battery pack for assigning to the first aircraft based on maximizing battery cycle life of the plurality of battery packs.

In any of these embodiments, determining assignments may include: identifying from among a plurality of the battery packs that are located at a first battery swapping location, multiple battery packs that have sufficient charge to meet energy requirements of a first aircraft that requires battery swapping at the first battery swapping location, and selecting, from among the multiple battery packs that have sufficient charge to meet energy requirements of the first aircraft, a first battery pack for assigning to the first aircraft based on the first battery pack having the highest state of health from among the multiple battery packs that have sufficient charge to meet energy requirements of the first aircraft.

In any of these embodiments, at least a portion of the status information for a respective battery pack may be received via a network connection with the respective battery pack.

In any of these embodiments, at least a portion of the status information for a respective battery pack may be received from a charging station connected to the respective battery pack.

In any of these embodiments, at least one of the battery packs of the plurality of battery packs may include a plurality of battery pack portions that are electrically isolated from one another and the status of the first battery pack received at the computing system may include a state of charge and a state of health for each of the battery pack portions.

In any of these embodiments, the assignments of at least a portion of the plurality of battery packs to the plurality of electric aircraft may include assignments for battery packs and aircraft at multiple different battery swapping locations.

In any of these embodiments, the energy requirements for the plurality of electric aircraft may be determined based on weather conditions.

In any of these embodiments, the aircraft may be manned.

In any of these embodiments, the aircraft may be a vertical take-off and landing aircraft.

According to various embodiments, a system for assigning swappable battery packs to electric aircraft includes one or more processors, memory, and one or more programs stored in the memory for execution by the one or more processors for: receiving status information for a plurality of battery packs located at at least one battery swapping location, wherein the status information comprises states of charge and states of health for the plurality of battery packs; determining energy requirements for a plurality of electric aircraft based at least in part on flight plans for the plurality of electric aircraft; and determining assignments of at least a portion of the plurality of battery packs to the plurality of electric aircraft based at least in part on the states of charge and states of health of the plurality of battery packs and the energy requirements for the plurality of aircraft.

In any of these embodiments, determining the assignments may include assigning battery packs that have higher states of health to aircraft that have higher energy requirements.

In any of these embodiments, determining assignments may include: identifying from among a plurality of the battery packs that are located at a first battery swapping location, multiple battery packs that can meet energy requirements of a first aircraft that requires battery swapping at the first battery swapping location, and selecting, from among the multiple battery packs that can meet energy requirements of the first aircraft, a first battery pack for assigning to the first aircraft based on maximizing battery cycle life of the plurality of battery packs.

In any of these embodiments, determining assignments may include: identifying from among a plurality of the battery packs that are located at a first battery swapping location, multiple battery packs that are fully charged and can meet energy requirements of a first aircraft that requires battery swapping at the first battery swapping location, and selecting, from among the multiple battery packs that can meet energy requirements of the first aircraft, a first battery pack for assigning to the first aircraft based on the first battery pack comprises the highest state of health from among the multiple battery packs that can meet energy requirements of the first aircraft.

In any of these embodiments, at least a portion of the status information for a respective battery pack may be received via a network connection with the respective battery pack.

In any of these embodiments, at least a portion of the status information for a respective battery pack may be received from a charging station connected to the respective battery pack.

In any of these embodiments, the statuses may include temperatures of the plurality of batteries.

In any of these embodiments, at least one of the battery packs of the plurality of battery packs may include a plurality of battery pack portions that are electrically isolated from one another and the status of the first battery pack received at the computing system may include a state of charge and a state of health for each of the battery pack portions.

In any of these embodiments, the assignments of at least a portion of the plurality of battery packs to the plurality of electric aircraft may include assignments for battery packs and aircraft at multiple different battery swapping locations.

BRIEF DESCRIPTION OF THE DRAWINGS

The invention will now be described, by way of example only, with reference to the accompanying drawings, in which:

FIG. 2 illustrates a power distribution architecture for powering the electric propulsion units of an aircraft, according to various embodiments;

DETAILED DESCRIPTION

Figure 1A:
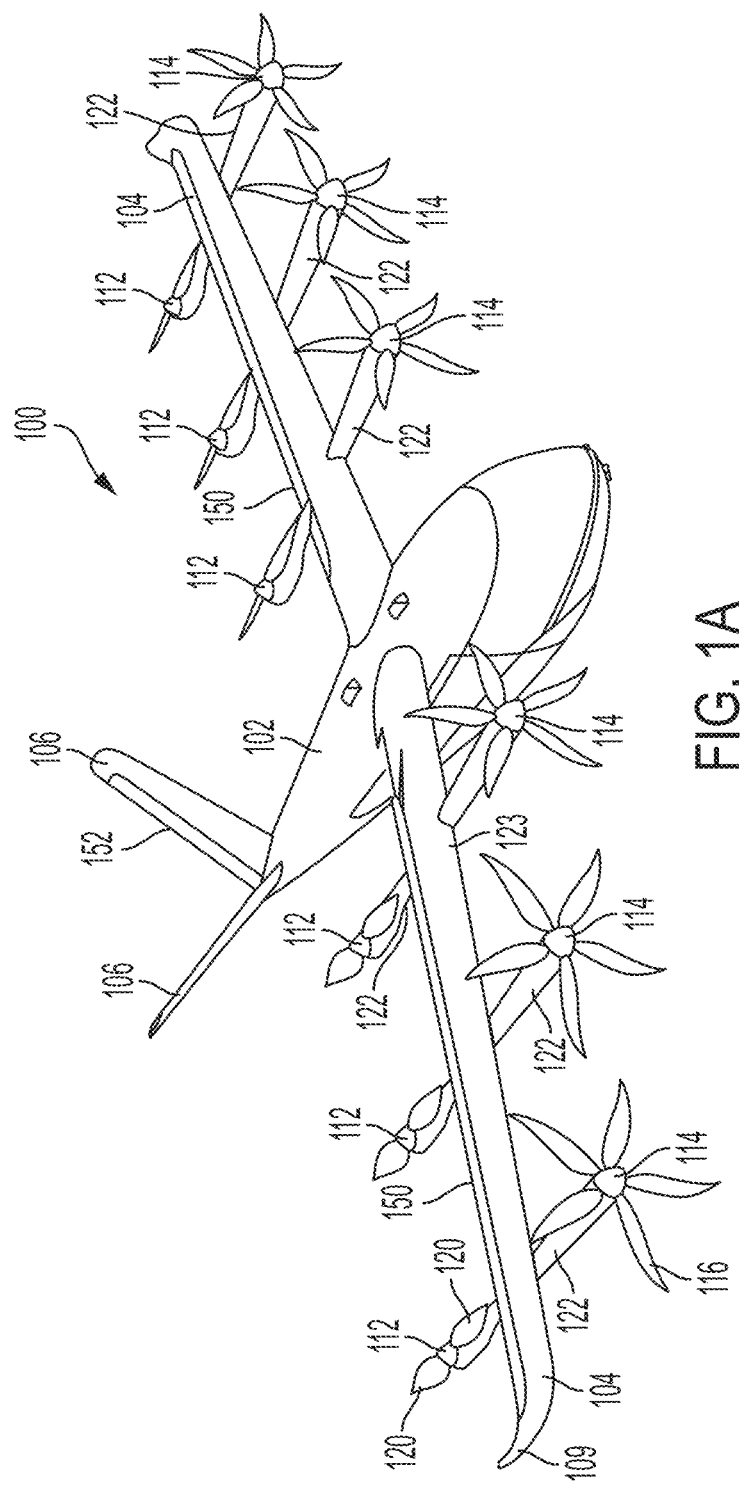
FIG. 1A shows a VTOL aircraft in a forward flight configuration, according to various embodiments.

According to various embodiments, systems and methods described herein include determining assignment for a network of swappable battery packs to different aircraft of a fleet of aircraft based on flight energy demands of the aircraft for the aircraft's planned flights and battery pack statuses. According to various embodiments, energy requirements are determined for upcoming aircraft flights, such as based on flight plans for a fleet of aircraft, and battery packs are assigned to the aircraft to meet the energy requirements. In some embodiments, battery packs may be assigned based on one or more optimization goals, such as increasing the number of battery pack usage cycles, minimizing aircraft downtime (increasing utilization), minimizing battery pack charging costs, and/or maximizing battery pack flexibility.

According to various embodiments, battery pack status information is communicated to a battery pack assignment determination system that uses the information to assign battery packs to aircraft/flights. In some embodiments, battery packs are assigned based, at least in part, on battery pack states of health. For example, battery packs with higher states of health may be assigned to higher energy requirement missions. According to various embodiments, this can allow for a higher minimum state of health estimate to be used when designing the battery packs and aircraft for achieving a maximum design flight range. A conventional system, which does not manage swappable battery packs, may design battery packs to be able to meet a maximum flight range criteria at a target state of health of, say, 80% (ensuring that a battery pack at 80% can still meet the maximum range of flight energy demands). In contrast, the systems and methods described herein enable the battery packs and aircraft to be designed to a higher state of health because the battery pack management system can ensure that a battery pack is available to meet any given flight energy requirement. This can enable battery packs to be made smaller, and as a result, aircraft to be made lighter, both of which reduce costs, in terms of both equipment costs and operating costs. Additionally, battery pack lifespan may be increased by enabling lower state of health battery packs to be identified and used for lower energy requirement flights (e.g., shorter flights), which can enable battery packs to continue to be used at state of health levels that are below typical retirement levels.

In the following description of the disclosure and embodiments, reference is made to the accompanying drawings in which are shown, by way of illustration, specific embodiments that can be practiced. It is to be understood that other embodiments and examples can be practiced, and changes can be made, without departing from the scope of the disclosure.

In addition, it is also to be understood that the singular forms "a," "an," and "the" used in the following description are intended to include the plural forms as well, unless the context clearly indicates otherwise. It is also to be understood that the term "and/or", as used herein, refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units, but do not preclude the presence or addition of one or more other features, integers, steps, operations, elements, components, units, and/or groups thereof.

As used herein, the term "proprotor" refers to a variable tilt propeller that can provide thrust for vertical lift and for forward propulsion by varying the tilt of the propeller.

As used herein, the term "battery pack" means any combination of electrically connected batteries (i.e., battery cells) and can include a plurality of batteries arranged in series, parallel, or a combination of series and parallel.

Figure 1B:
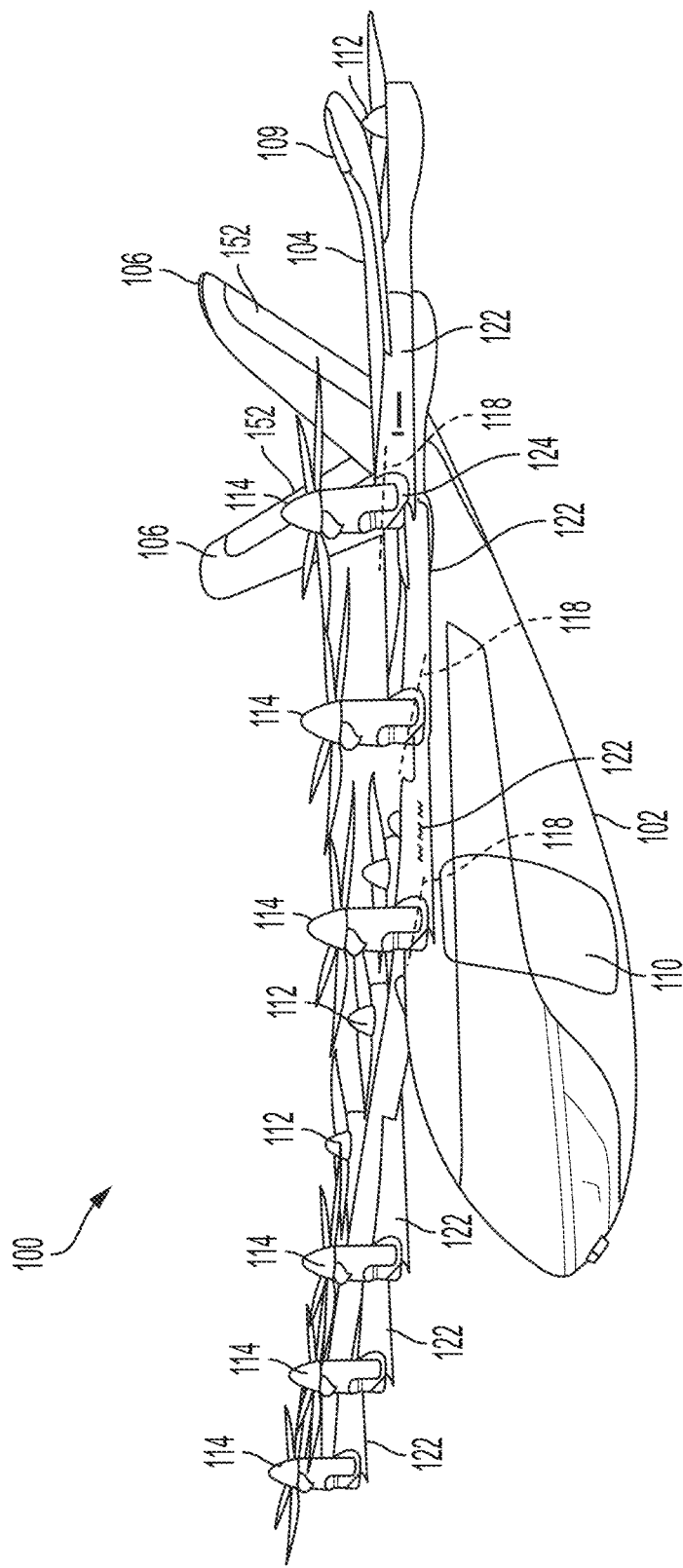
FIG. 1B shows a VTOL aircraft in a takeoff and landing configuration, according to various embodiments.

FIGS. 1A and 1B illustrate an electric VTOL aircraft 100 in a cruise configuration and a vertical take-off and landing configuration, respectively, according to various embodiments. The aircraft 100 includes a fuselage 102, wings 104 mounted to the fuselage 102, and one or more rear stabilizers 106 mounted to the rear of the fuselage 102. The aircraft 100 includes a plurality rotors 112 and a plurality of proprotors 114 (collectively referred to herein as EPUs). The EPUs (112, 114) generally include an electric motor driving a plurality of blades and a motor controller for controlling/powering the motor. In some embodiments, the pitch of the blades of one or more of the EPUs can be controlled in-flight.

Rotors 112 are mounted to the wings 104 and are configured to provide lift for vertical take-off and landing. Proprotors 114 are mounted to the wings 104 and are tiltable between lift configurations in which they provide a portion of the lift required for vertical take-off and landing and hovering, as shown in FIG. 1B, and propulsion configurations in which they provide forward thrust to the aircraft 100 for horizontal flight, as shown in FIG. 1A. As used herein, a proprotor lift configuration refers to any proprotor orientation in which the proprotor thrust is providing primarily lift to the aircraft and a proprotor propulsion configuration refers to any proprotor orientation in which the proprotor thrust is providing primarily forward thrust to the aircraft.

According to various embodiments, the rotors 112 are configured for providing lift only, with all propulsion being provided by the proprotors. Accordingly, the rotors 112 may be in fixed positions. During take-off and landing, the proprotors 114 are tilted to lift configurations in which their thrust is directed upward to provide additional lift. In some embodiments, the rotors 112 are tiltable for thrust vectoring.

For forward flight, the proprotors 114 tilt from their lift configurations to their propulsion configurations. In other words, the tilt of the proprotors 114 is varied from a range of tilt positions in which the proprotor thrust is directed upward to provide lift during vertical take-off and landing and during hover to a range of tilt positions in which the proprotor thrust is directed forward to provide forward thrust to the aircraft 100. The proprotors tilt about axes 118 that are perpendicular to the forward direction of the aircraft 100. When the aircraft 100 is in full forward flight, lift may be provided entirely by the wings 104, and the rotors 112 may be shut-off. The blades 120 of the rotors 112 may be locked in a low drag position for aircraft cruising. In some embodiments, the rotors 112 each have two blades 120 that are locked for cruising in minimum drag positions in which one blade is directly in front of the other blade as illustrated in FIG. 1A. In some embodiments, the rotors 112 have more than two blades. In some embodiments, the proprotors 114 include more blades 116 than the rotors 112. For example, as illustrated in FIGS. 1A and 1B, the rotors 112 may each include two blades and the proprotors 114 may each include five blades. According to various embodiments, the proprotors 114 can have from 2 to 5 blades.

According to various embodiments, the aircraft includes only one wing 104 on each side of the fuselage 102 (or a single wing that extends across the entire aircraft) and at least a portion of the rotors 112 are located rearward of the wings 104 and at least a portion of the proprotors 114 are located forward of the wings 104. In some embodiments, all of the rotors 112 are located rearward of the wings 104 and all of the proprotors are located forward of the wings 104. According to some embodiments, all rotors 112 and proprotors 114 are mounted to the wings—i.e., no rotors or proprotors are mounted to the fuselage. According to various embodiments, the rotors 112 are all located rearward of the wings 104 and the proprotors 114 are all located forward of the wings 104. According to some embodiments, all rotors 112 and proprotors 114 are positioned inward of the wing tips 109.

According to various embodiments, the rotors 112 and proprotors 114 are mounted to the wings 104 by booms 122. The booms 122 may be mounted beneath the wings 104, on top of the wings, and/or may be integrated into the wing profile. According to various embodiments, one rotor 112 and one proprotor 114 are mounted to each boom 122. The rotor 112 may be mounted at a rear end of the boom 122 and a proprotor 114 may be mounted at a front end of the boom 122. In some embodiments, the rotor 112 is mounted in a fixed position on the boom 122. In some embodiments, the proprotor 114 is mounted to a front end of the boom 122 via a hinge 124. The proprotor 114 may be mounted to the boom 122 such that the proprotor 114 is aligned with the body of the boom 122 when in its propulsion configuration, forming a continuous extension of the front end of the boom 122 that minimizes drag for forward flight.

According to various embodiments, the aircraft 100 may include multiple wings on each side of the aircraft 100, only one wing on each side of the aircraft 100, or a single wing that extends across the aircraft 100. According to some embodiments, at least one wing 104 is a high wing mounted to an upper side of the fuselage 102. According to some embodiments, the wings include control surfaces 150, such as flaps and/or ailerons, which are positioned via one or more control surface actuators (not shown). According to some embodiments, the wings can have curved wing tips 109 for reduced drag during forward flight. According to some embodiments, the rear stabilizers 106 include control surfaces 152, such as one or more rudders, one or more elevators, and/or one or more combined rudder-elevators that are positioned via one or more control surface actuators (not shown). The wing(s) may have any suitable design. In some embodiments, the wings have a tapering leading edge 123, as shown for example, in the embodiment of FIG. 1A. In some embodiments, the wings have a tapering trailing edge.

FIG. 2 illustrates a power distribution architecture for powering the EPUs (112, 114) of aircraft 100, according to various embodiments. Although FIGS. 1A-2A illustrates 12 EPUs (numbered 1-12 in FIG. 2A) mounted to wings 104, aircraft according to various embodiments can have any suitable number of EPUs, including four, six, eight, ten, fourteen, eighteen, twenty, or more. The EPUs are powered by a battery pack 200. The battery pack 200 may include multiple battery pack portions—numbered 1 through 6 in the illustrated embodiment—that power different portions of the EPUs. In the illustrated embodiment, each battery pack portion of the battery pack 200 powers two EPUs. For example, EPUs 1 and 12 are powered by battery pack portion 1 via distribution bus 202 and EPUs 2 and 11 are powered by battery pack portion 2 via distribution bus 204. In some embodiments, a battery pack powers all of the EPUs in parallel. In some embodiments, an aircraft includes more than one battery pack.

Figure 3:
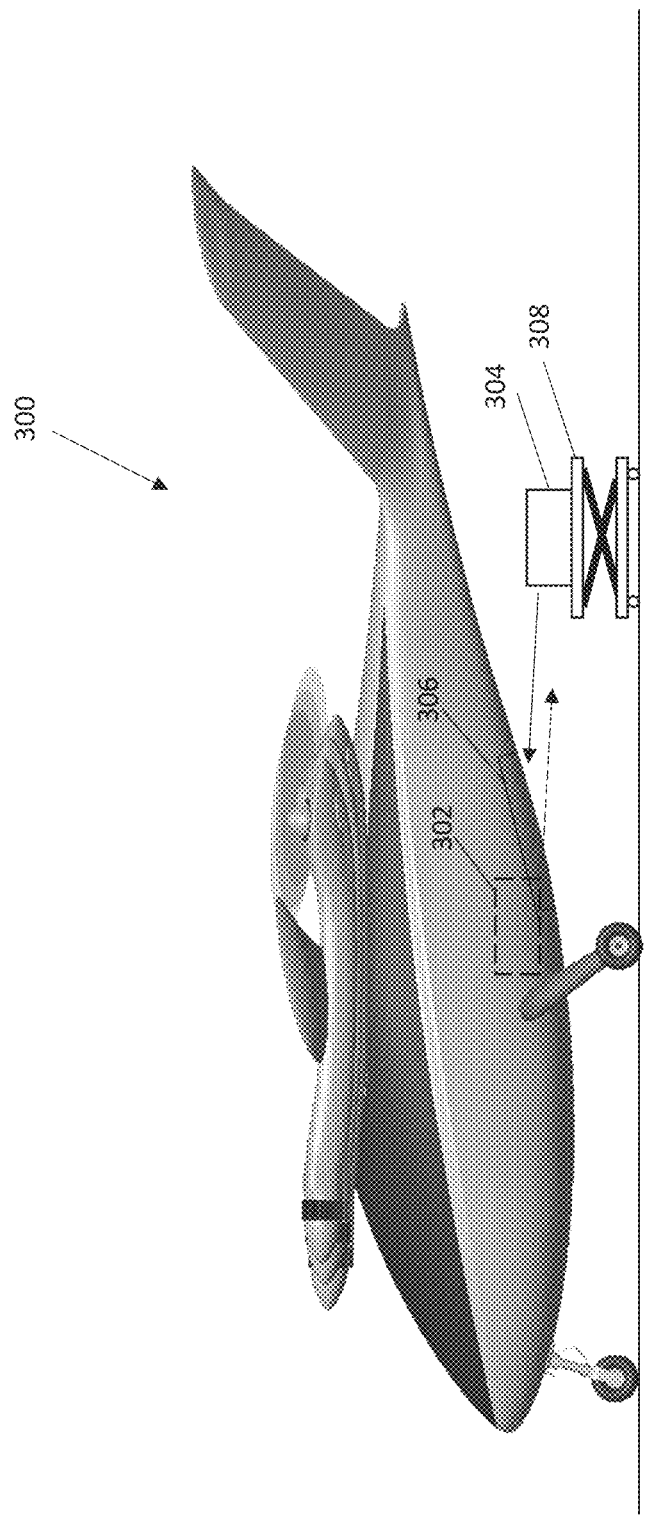
FIG. 3 is a conceptual illustration of battery pack swapping for an eVTOL aircraft, according to various embodiments.

Battery pack 200 is recharged as needed to ensure that it has sufficient charge to power aircraft 100 for flight. To minimize aircraft downtime, battery pack 200 may be a swappable battery pack that may be swapped out with a charged battery pack, such as after each flight or otherwise as needed. The ability to swap battery packs may reduce aircraft downtime that would otherwise be required for charging the battery pack in situ. FIG. 3 is a conceptual illustration of battery pack swapping for an eVTOL aircraft. eVTOL aircraft 300, which may have just completed a flight, may have a discharged battery pack 302 that has a charge level that is below the level required for the next flight planned for the aircraft. A charged battery pack 304 may be swapped in for the discharged battery pack 304, such as at a vertiport (a vertical take-off and landing airport) where the eVTOL aircraft 300 is located. Aircraft 300 may have a battery pack access port 306 that enables access to the battery mounting location of the aircraft 300. Battery packs 302, 304 may be swapped in/out via a battery pack transporter 308, which may be a manually operated cart that facilitates manual swapping of the battery packs 302, 304 or may be a robotic vehicle for automatically swapping of the battery packs 302, 304.

Figure 4:
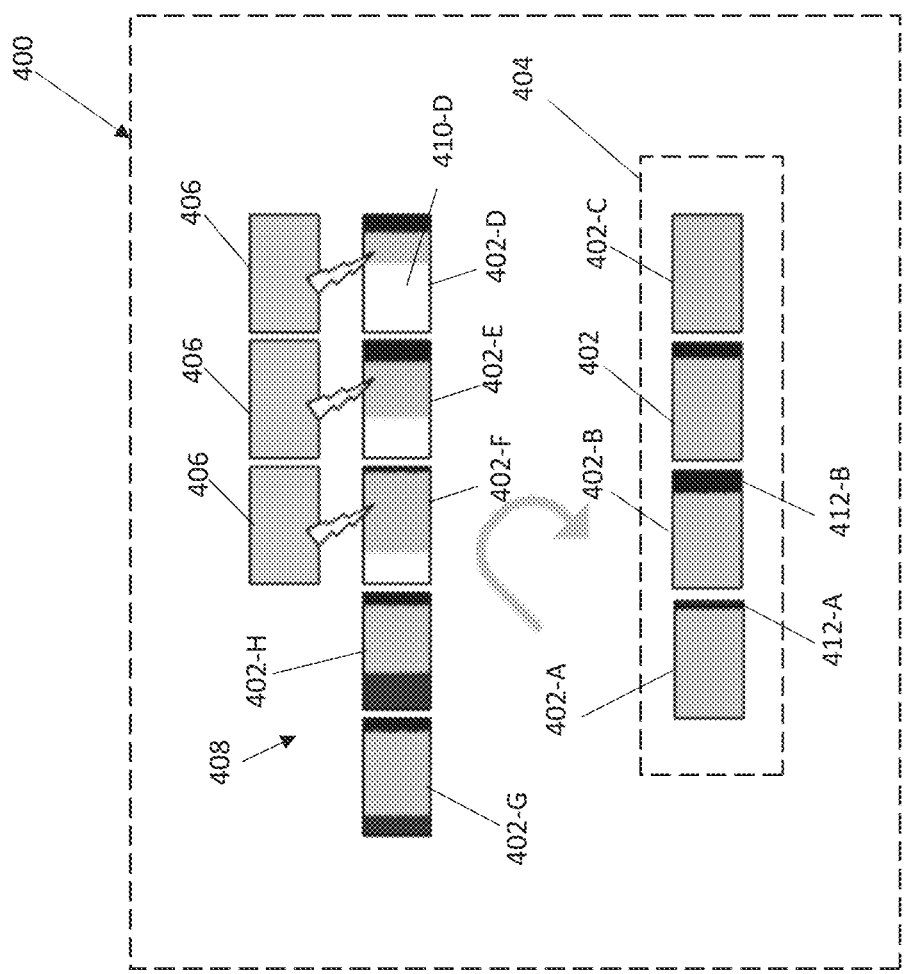
FIG. 4 illustrates a vertiport that includes multiple battery packs for swapping into aircraft that land at the vertiport, according to various embodiments.

After swapping out discharged battery pack 302 for charged battery pack 304, the discharged battery pack 302 may be charged for a next use. A vertiport for eVTOL aircraft may include multiple battery packs for swapping into aircraft that land at the vertiport and may include one or more chargers for charging battery packs between uses. FIG. 4 illustrates a vertiport 400 that includes multiple battery packs 402 for swapping into aircraft that land at the vertiport 400, according to various embodiments. The battery packs are at different states of charge (SOC), which as is known in the art is a measure of the stored charge expressed as a percentage of the current capacity of the battery pack. Four charged battery packs are located in a charged battery pack storage 404 and are ready for swapping into an aircraft. Three battery packs are hooked up to charging stations 406 and are being charged. Two battery packs 402 are awaiting charging in a charging queue 408.

The battery packs 402 are illustrated as having different states of health (SOH), which as is known in the art is a measure of the battery pack's ability to store and delivery electrical energy compared to a new battery pack. As is known in the art, the state of health of a battery pack generally decreases over a number of cycles of discharge and recharge of the battery pack. A battery pack may be retired after its health drops below a certain level (for example, eighty percent of maximum health). A reduction in a state of health relative to full health of a respective battery pack is illustrated in FIG. 4 by a band on a right-hand side of the battery pack. For example, battery pack 402-A in charged battery pack storage 404 has a small reduction in health indicated by band 412-A. Battery pack 402-B has a lower state of health than battery pack 402-A as indicated by the relatively large band 412-B. Battery pack 402-C has full health as indicated by the absence of a band. The states of charge of the charging battery packs and queued battery packs are indicated by left-hand side bands. Battery pack 402-D is nearly charged as indicated by band 410-D. The other two charging battery packs 402-E and 402-F will require more time before they are fully charged (relative to their states of health). The left-hand side band of the charging battery packs 402-F, 402-E, and 402-D is a lighter shade than the left-hand side band of the queued battery packs 402-G and 402-H to indicate that the charging battery packs are charging. Queued battery packs 402-G and 402-H have different states of charge due, for example, to different energy discharges of the respective flights that the battery packs 402-G, 402-H powered.

Figure 5:
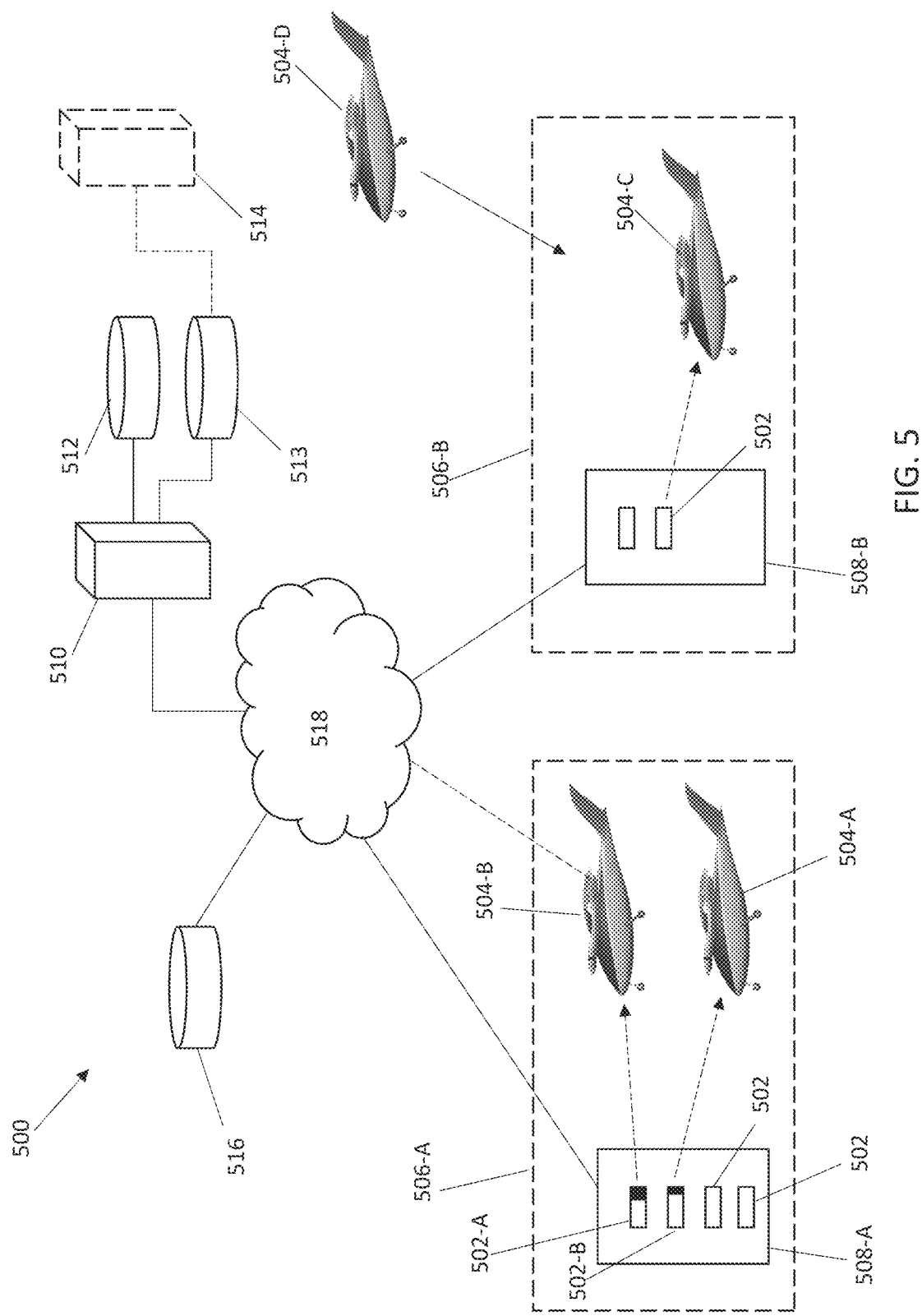
FIG. 5 illustrates a system for managing assignment of battery packs to aircraft, according to various embodiments.

As explained above with respect to FIG. 4, a given vertiport may include multiple battery packs in different states of health and different states of charge. Multiple battery packs may be available for swapping into aircraft at a vertiport and multiple aircraft may require one or more battery pack swaps in a given period of time. FIG. 5 illustrates a system 500 for managing assignment of a network of battery packs 502 to a fleet of aircraft 504A-D, according to various embodiments. FIG. 5 illustrates two vertiports 506-A and 506-B, which could be located, for example, in different parts of a city or in different cities. Aircraft 504 may make multiple trips between the vertiports 506-A and 506-B, such as to ferry passengers between the locations. FIG. 5 illustrates two aircraft 504-A and 504-B parked at vertiport 506-A, one aircraft 504-C parked at vertiport 506-B, and one aircraft 504-D on its way to vertiport 506-B Each vertiport may include a local battery management facility 508-A, 508-B that may include one or more charging stations and storage areas for battery packs in different stages of charge. In the illustrated example, battery management facility 508-A includes four battery packs 502 and battery management facility 508-B includes two battery packs 502.

System 500 includes a battery pack assignment system 510 for determining assignments of battery packs 502 to aircraft 504. Assignment system 510 receives information related to the statuses of battery packs 502 of each vertiport 506-A, 506-B, such as via a communication network 518. Examples of battery pack status information that may be received by assignment system 510 include state of charge, state of health, whether or not a battery pack is fully charged, and a temperature of a battery pack. Status information may be determined by the battery pack itself (e.g., a battery pack management system of the battery pack) or by a system coupled to the battery pack, such as a charging station and/or an aircraft. Status information may be received on an on-going basis, such on a scheduled period, in response to changes in status, and/or in response to queries by the assignment system 510.

In some embodiments, one or more battery packs 502 may include communication modules configured for sending status information to assignment system 510. In some embodiments, battery pack status information is collected from the battery packs and transmitted to the assignment system 510. For example, a charging station located at the local battery management facility 508-A, 508-B may receive and/or detect battery pack status from a respective battery pack and may provide the information to assignment system 510. In some embodiments, each local battery management facility 508-A, 508-B may include a local battery management computing system that may collect battery pack status information from battery packs and/or chargers and provide the battery pack status information to assignment system 510. Assignment system 510 may also receive information from one or more charging stations (e.g., charging stations 406 of FIG. 4), such as whether the charging station is currently charging or is available for charging, a time to finish charging a battery pack, a temperature of a connected battery pack, and/or states of health of a connected battery pack.

According to some embodiments, assignment system 510 may store battery pack status information and/or charger information in a database 512 and may update database 512 as battery pack status and/or charger information is received at assignment system 510. Other types of battery pack related information may be stored in database 512, which can include historical data, such as a number of flights for a battery pack, the time a battery pack has been in service, and/or a repair history for a battery pack.

Assignment system 510 may determine assignments of battery packs to aircraft based on energy requirements of aircraft for upcoming flights. In some embodiments, assignment system 510 is configured for determining energy requirements for upcoming flights. In some embodiments, assignment system 510 may access flight schedules, such as stored in a database 513, which may be a local database or a remote database, to determine aircraft energy requirements. In some embodiments, the flight schedules are provided by a flight scheduling system 514. The flight schedules may include information such as departure and arrival times, departure and arrival locations, flight altitude and speed, a number of passengers, and/or any other flight planning related information. The flight schedules may be used by assignment system 510 to estimate an amount of energy required for an aircraft to complete a given flight. In some embodiments, assignment system 510 may receive weather information from a weather service 516 and may use the weather information for determining energy estimates for flights (e.g. for determining head-winds, tail-winds, air pressures, air temperatures, etc.).

In some embodiments, assignment system 510 may receive aircraft information associated with aircraft available for meeting the flight schedules. In some embodiments, the aircraft 504 may communicate with the assignment system 510 to provide status information, such as aircraft location, aircraft health information, battery pack status information for a battery pack loaded onto the aircraft, aircraft payload weight, and/or any other useful information. In some embodiments, aircraft information provided to assignment system 510 includes aircraft operational capabilities, such as range, power, number of EPUs, etc.

Assignment system 510 determines assignments for battery packs 502 to aircraft 504 based on estimated energy requirements for upcoming flights and battery status information. Assignment system 510 ensures that a battery pack assigned to an aircraft for a given flight has a state of charge that is sufficient to meet the energy requirement for the flight. Assignment system 510 may assign battery packs to achieve other objectives, such as maximizing battery pack lifespan, reducing aircraft downtime, minimizing battery pack charging cost, maximizing flexibility, etc. For example, in FIG. 5, assignment system 510 may assign battery pack 502-A and battery pack 502-B based, at least in part, on their health statuses such that the battery pack with the higher health status (battery pack 502-B) is assigned to the aircraft/flight that has a higher energy requirement (aircraft 504-A). According to various embodiments, by assigning battery packs based on their health status, the number of cycles that a battery pack may be used can be increased relative to situations in which battery packs are retired once they can no longer support the maximum range mission. In some embodiments, assignment system 510 can manage battery packs in other ways, including, for example, controlling when, how, and for how long battery packs are charged, designating battery packs for retirement or repair, and/or any other battery pack management tasks.

Figure 6:
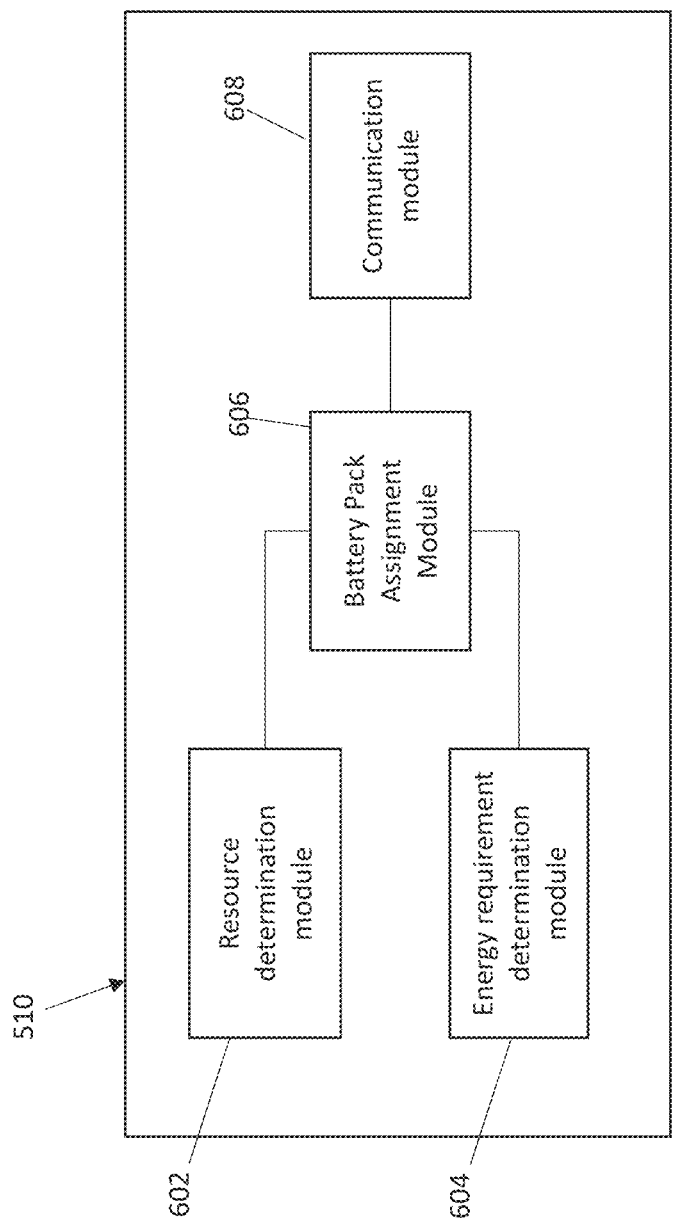
FIG. 6 is a functional block diagram of assignment system, according to various embodiments.

FIG. 6 is a functional block diagram of assignment system 510, according to various embodiments. Assignment system 510 is a processor-based computing systems that can communicate with one or more computing systems located at each vertiport to receive information related to statuses of battery packs located at each vertiport for determining battery pack assignments for a set of upcoming flights based on the energy demands of the flights. Assignment system 510 includes a resource determination module 602 that tracks the factors required for determining assignments of battery packs to aircraft. Resources tracked by resource determination module 602 can include battery pack locations, battery pack statuses (e.g., states of charge, states of health, etc.), the aircraft in operation, including their locations, flight schedules, and vertiport locations or destinations, etc., and flight schedules. Energy requirement determination module 604 determines the energy requirements for at least a portion of the aircraft based on the flight schedules and weather information. For example, energy requirement determination module 604 may determine that a scheduled flight from vertiport A to vertiport B with a tail wind may require energy X based on the flight distance, flight altitude, aircraft speed, and tail wind speed and that a scheduled return flight may require energy of 1.2× due to the wind along the reverse route being a head wind.

Assignment system 510 includes a battery assignment module 606 for determining battery assignments based on the available resources tracked by resource determination module 602 and the energy requirements for the scheduled flights determined by energy requirement determination module 604. Battery assignment module 606 may assign battery packs available at a given vertiport to the aircraft that depart from the vertiport. Battery assignment module 606 determines which battery packs have a state of charge (and/or will have a state of charge for battery packs that may be currently charging) sufficient for meeting the energy requirements for the various flights departing each vertiport. Battery assignment module 606 may determine assignments for a certain period of future flights, such as for a day of flights, two days of flights, a week of flights, etc. Assignment module 606 may update assignments as changes in the aircraft fleet and battery network occur. For example, when a battery pack completes its charging, the assignment module 606 may update assignments based on the availability of the newly charged battery pack.

In some embodiments, a sufficient number of battery packs may be available at one or more of the vertiports that the assignment module can assign battery packs to achieve one or more optimization goals. For example, assignment module 606 may determine assignments that may maximum lifespan of battery packs in the network, minimize aircraft downtime, reduce charging cost, maximize recoverability of the battery pack network should a disruption occur, or any combination of these or other optimization goals. In some embodiments, battery assignment module 606 may minimize downtime by seeking to ensure that a battery pack with sufficient charge is ready when needed for a particular flight. Maximizing battery pack lifespan may be achieved by assigning battery packs based on battery pack states of health and flight energy requirements. For example, higher energy requirement flights may be assigned battery packs with higher states of health. Reducing charging cost may prioritize battery pack assignment that enable over-night charging, when electricity costs are typically the minimum. Maximize recoverability of the battery pack network should a disruption occur may prioritize not assigning one or more higher state of charge battery packs so that they are available should another battery pack become unavailable (such as due to a failure mode) or should an unscheduled flight arise. In some embodiments, assignment module 606 may prioritize one or more of these goals over one or more other goals. For example, minimizing aircraft downtime may be prioritized over minimizing charging costs.

In some embodiments, assignment system 510 may determine other aspects of the battery pack network, such as the charging scheduling for battery packs. For example, assignment system 510 may determine the order of charging of battery packs, such as to prioritize battery packs that have higher states of health or to delay charging of a battery pack that is too hot for charging (e.g., the battery pack may have just been swapped out of an aircraft after a recently-completed flight). In some embodiments, assignment system 510 may control a rate of charging of a battery pack. For example, assignment system 510 may determine that rapid charging of a battery pack is needed to ensure that the battery pack is charged in time for a scheduled departure of a flight and may direct a battery pack to a rapid charging station or may control a charging station to switch to a rapid charging mode.

Assignment system 510 includes a communication module 608 for communicating with various components of the aircraft fleet and battery pack network, including for receiving information associated with determining battery pack assignments (battery pack statuses, aircraft statuses, flight plans, weather forecasts, etc.). Communication module 608 may be configured for communicating battery pack assignments. In some embodiments, communication module 608 may provide battery pack assignments for display to operators that may swap battery packs according to the assignments. For example, a schedule of battery pack assignments may be provided to operators at each vertiport. In some embodiments, communication module 608 may communicate with one or more systems that automate battery swapping. For example, a robotic battery swapping system may automatically swap batteries or may automatically position battery packs at aircraft for manual or semi-automated swapping. The communication module 608 may communicate battery pack assignments to a local battery pack swapping system that may then swap battery packs or facilitate battery pack swapping based on the assignments.

Figure 7:
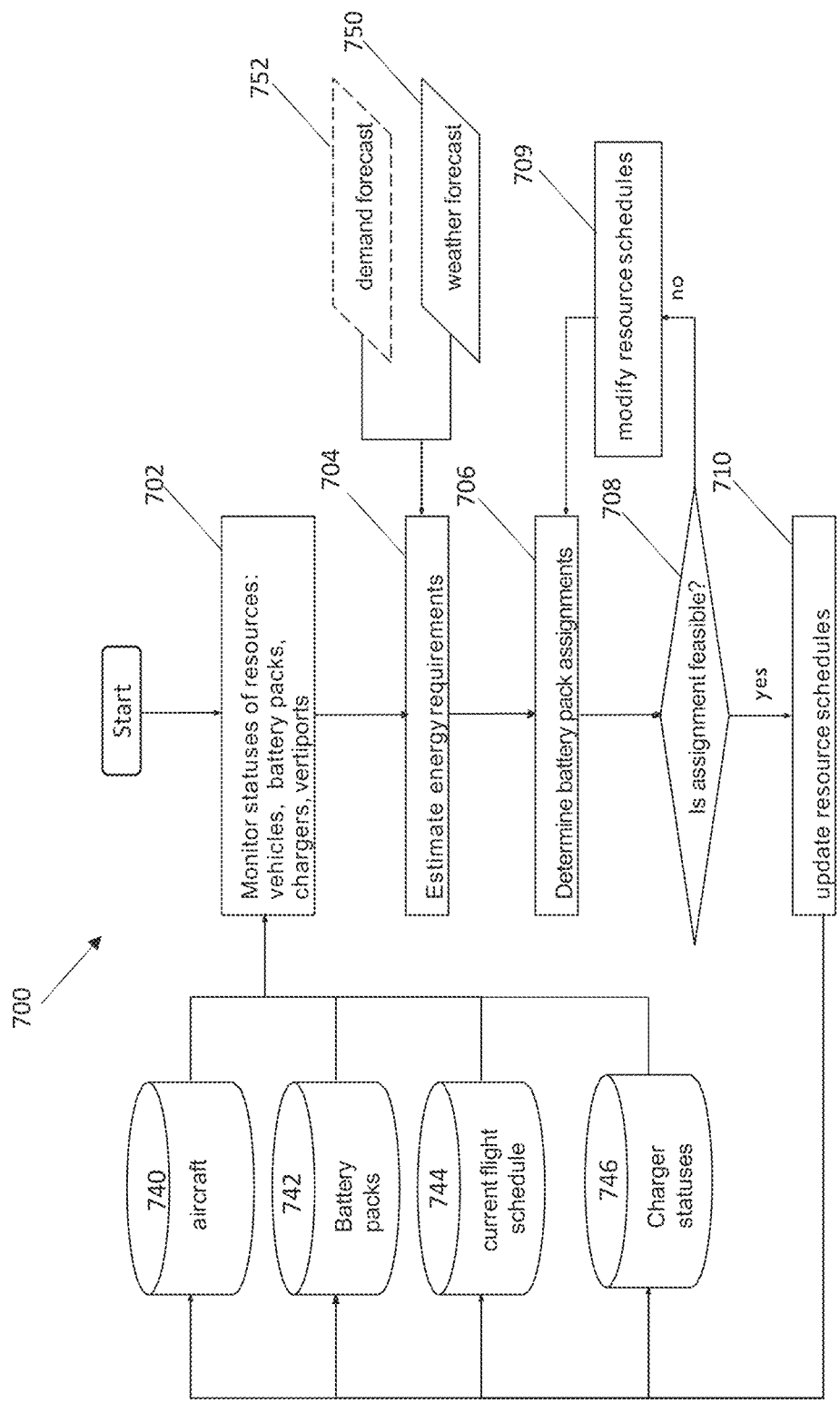
FIG. 7 illustrates a method for determining battery assignments, according to various embodiments.

FIG. 7 illustrates a method 700 for determining battery assignments, according to various embodiments. Method 700 may be performed by an assignment system, such as assignment system 510 of FIG. 6. At step 702, resources states are monitored based on information received from the respective resources or subsystems that manage the resources. For example, information related to aircraft statuses 740, battery pack statuses 742, flight schedules 744, and charger statuses 746 may be used to monitor that statuses of the resources. Aircraft statuses 740 can include locations of aircraft in the fleet, availability of aircraft, aircraft attribute information that is related to the configuration of aircraft (to the extent the fleet has different aircraft configurations), and/or any other relevant information. Battery pack statuses 742 can include battery pack states of charge (how much energy the battery pack is storing at a given time), battery pack state of health (e.g., the current charge storage capacity of the battery pack relative to its nominal capacity and/or battery pack internal resistance), battery pack temperature, battery pack configuration (e.g., where the battery pack network includes multiple battery pack configurations that may fit one or more different aircraft configurations), etc. Flight schedules 744 can include departure and arrival locations, departure and arrival times, flight paths, flight altitude, flight speed, flight take-off and landing characteristics, and/or any other flight path related information. The charger statuses 746 can include charger availability (e.g., whether the charger is currently charging a battery pack), charger capabilities (e.g., charge rates), charger locations, and/or any other useful charger-related information.

At step 704, energy requirements for aircraft for upcoming flights are determined based on at least some of the resource information from step 702 and weather forecast information 750. The energy requirements is the amount of electrical energy that a given aircraft will need to complete a given mission (with a margin of safety). The energy requirement for a given flight may be calculated according to known methods from various factors, including aircraft-related factors, such as aircraft weight, aircraft efficiency, and EPU configuration, from flight planning factors such as the flight distance and speed and the aircraft payload, and from weather-related factors such as wind directions and speeds, and air temperature and pressure. In some embodiments, demand forecasts 752 may be used in determining energy requirements. Demand forecasts 752 may include forecasts for future flight needs—i.e., forecasts of flights that have not yet been scheduled and, thus, are not included in flight schedule 744. Demand forecasts 752 may be useful where, for example, the current flight schedule 744 does not extend adequately into the future, such as where flight scheduling is on-demand. Demand forecasts 752 can enable the assignment system to account for future energy needs further into the future than reflected in the current flight schedule 744.

Energy requirements may be determined for one or more upcoming flights. In some embodiments, energy requirements are estimated for all planned upcoming flights. In some embodiments, energy requirements are estimated for upcoming flights within a certain period, such as for a period of hours, a day, a number of days, a week, etc. In some embodiments, energy requirement estimates are updated any time battery assignments are determined regardless of whether the factors underlying the energy estimates have changed. In some embodiments, energy requirement estimates are determined in response to new information related to estimating energy requirements being received. For example, a change in the weather forecast or change in flight plan may trigger an update in energy requirement estimates.

Figure 11:
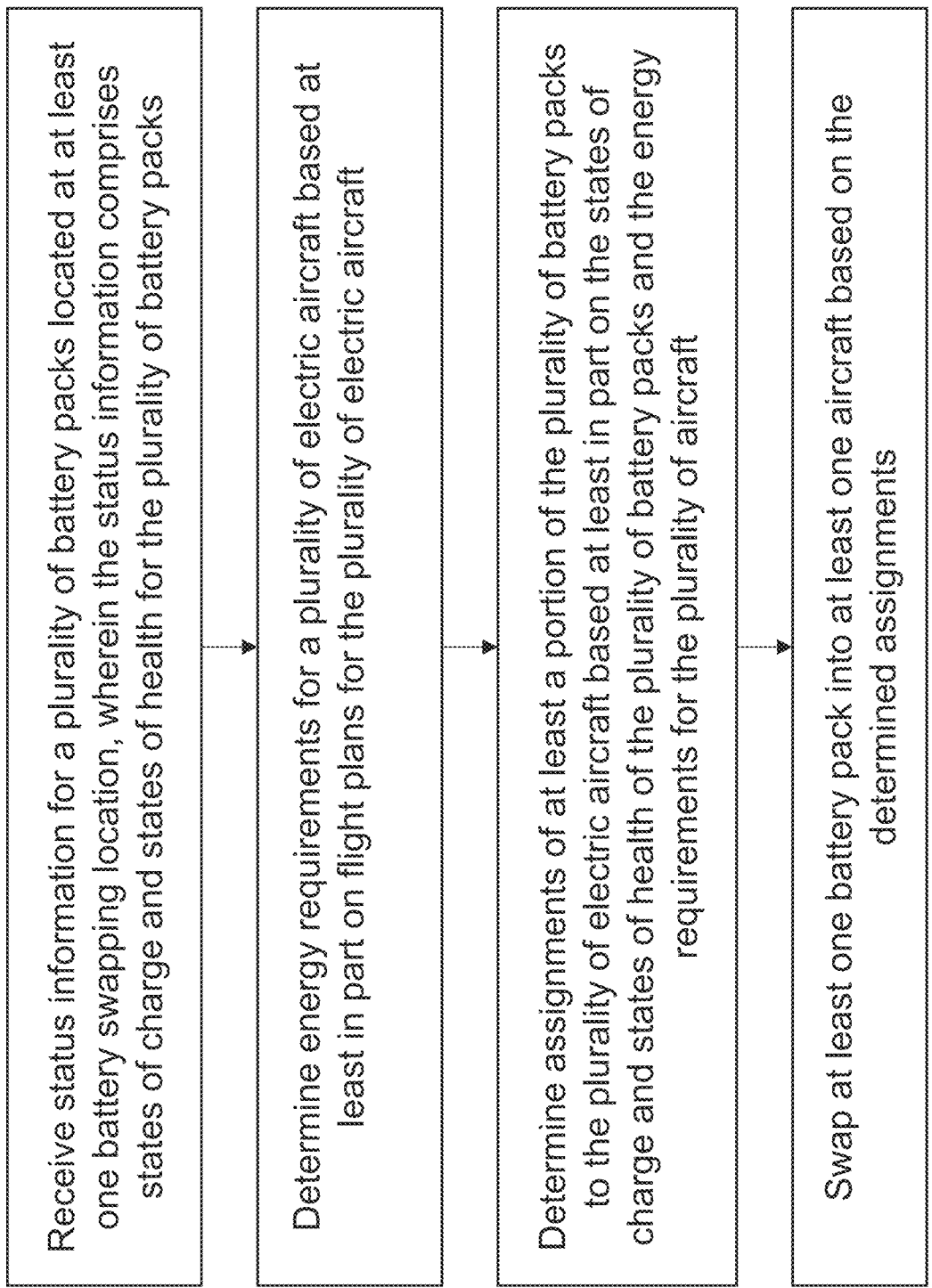
FIG. 11 illustrates a method for assigning swappable battry packs to electric aircraft, according to various embodiments.

At step 706, battery assignments are determined based on the energy requirements determined in step 704 and at least some of the resource related information from step 702. At the most basic level, battery pack assignments are determined such that each planned flight (or each planned flight in a certain period of time) has a battery pack assigned to it that can support the aircraft's energy requirements for completing the flight. The battery pack assignments are determined based on the energy requirements and battery pack status information, such as battery pack states of charge and battery pack health. In some embodiments, step 706 can include assigning battery packs based on one or more additional goals (other than meeting flight energy requirements). For example, battery packs may be assigned to maximize battery pack life, maximize aircraft availability, maximize battery pack network flexibility, and/or reduce battery pack charging costs. In some embodiments, battery pack assignments can include more than one goal that may be prioritized or equally weighted. According to various embodiments, battery pack assignments are determined using one or more optimization algorithms that solve an online dynamic resource allocation problem. In some embodiments, an online dynamic resource allocation algorithm is formulated as integer or mixed-integer programming problem (i.e. an optimization problem). The online dynamic resource allocation algorithm can include an objective function that can be a linear combination of objectives. The objectives may represent specific goals, such as minimizing cost, minimizing peak charging power, maximizing battery life, and minimizing disruption to the flight schedule. According to various embodiments, the decision variables of the online dynamic resource allocation algorithm can be the locations of the respective resources at each time (e.g., the location of battery packs, such as in an aircraft, on a charger, in a queue, etc.). The algorithm includes various bounds on the possible values of the decision variables and various constraints that limit the solution space. Exemplary constraints include that each battery pack can only be in one location at each time, that only one battery pack can be attached to each charger, that only one battery pack can be assigned to an aircraft, and that a battery pack assignment cannot change until the end of its flight. The online dynamic resource allocation algorithm determines the set of decision variables that minimize the objective function subject to the bounds and constraints. FIG. 11 illustrates a method for assigning swappable battry packs to electric aircraft, according to various embodiments.

In some embodiments, battery pack assignments are determined on a location-by-location basis and the battery pack assignment goal(s) may be different for different locations. For example, battery pack assignments for a first vertiport may seek to maximize battery pack life as a primary goal while battery pack assignments for a second vertiport may seek to minimize charging costs as a primary goal.

At step 708, a determination may be made whether the battery pack assignments from step 706 are feasible. For example, a determination may be made that the battery pack assignments are not feasible because a battery pack is not available for at least one planned flight. If the battery pack assignments are not feasible as determined in step 708, then one or more resource schedules may be modified at step 709. For example, one or more scheduled flights may be delayed or canceled.

If the battery pack assignments are feasible as determined in step 708, then the process proceeds to step 710 in which the resource schedules are updated. For example, battery pack assignments may be updated to indicate which battery packs are assigned to which flights. In some embodiments, step 710 may include providing battery pack assignment information to one or more battery swapping facilities, such as to inform local operators of the determined battery pack assignments and/or to control one or more automated or semi-automated battery pack swapping systems (e.g., a robotic battery pack swapping system).

Figure 8:
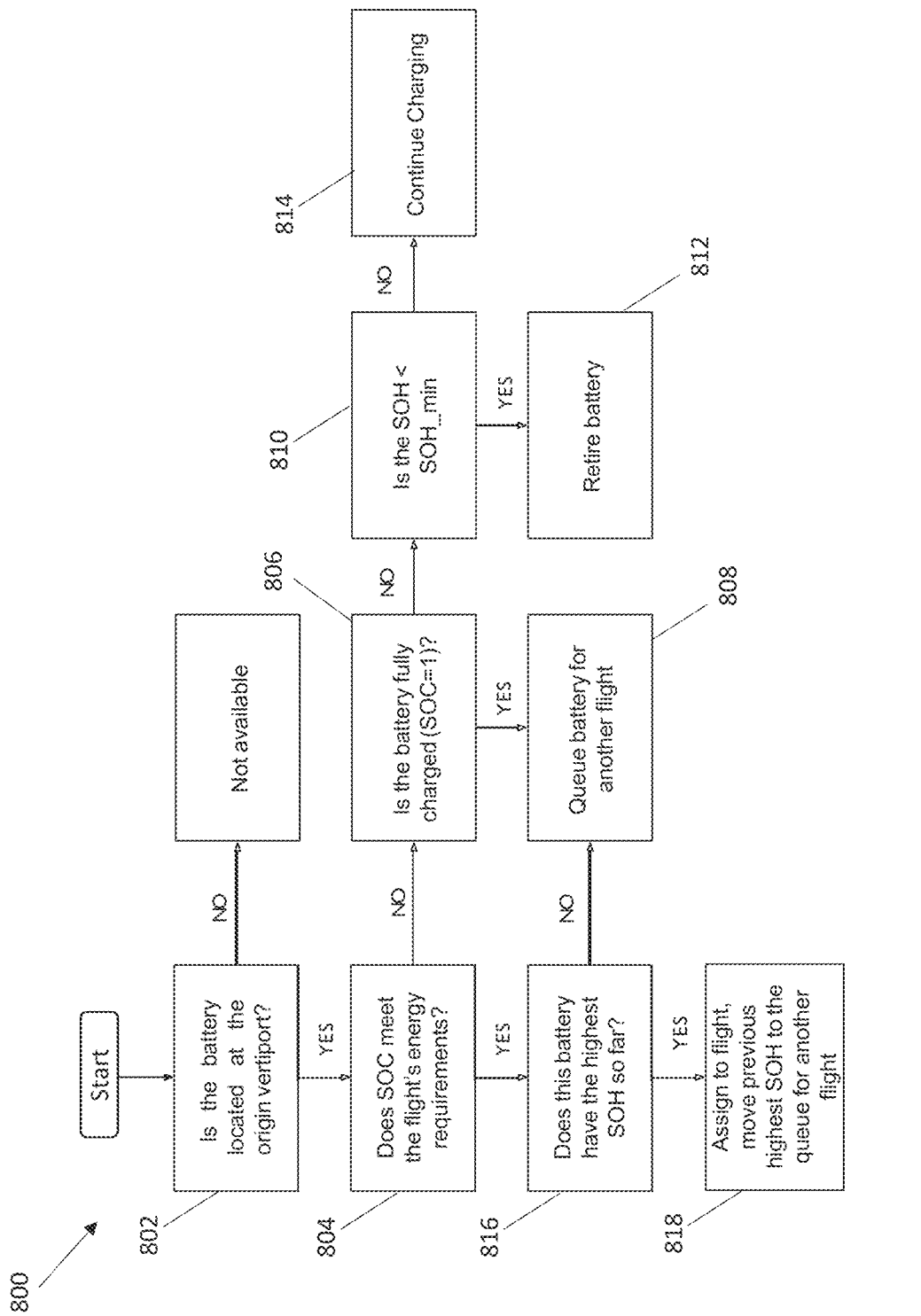
FIG. 8 illustrates an example of a battery pack assignment determination method, according to various embodiments.

FIG. 8 illustrates an example of a battery pack assignment determination method, according to various embodiments. Battery pack assignment determination method 800 may be used by battery pack assignment module 606 of FIG. 6 for determining battery pack assignments in step 706 of method 700 of FIG. 7. Method 800 generally seeks to meet the planned flight energy requirements while maximizing battery pack cycle life (the number of discharge/recharge cycles the battery packs undergoes until it is retired). Method 800 may select the battery pack with the highest energy requirements from among the battery packs at a given location that have sufficient charge to meet energy requirements for a given flight/aircraft. The steps of method 800 may be applied to each of a plurality of battery packs at one or more locations (e.g., vertiports) and may be applied to each of a plurality of planned flights for the one or more locations. In some embodiments, method 800 is performed for each of a plurality of planned flights in order of energy requirements for the planned flights, such as highest energy requirement to lowest energy requirement.

At step 802, for a given battery pack and given scheduled flight, a determination may be made whether the battery pack is located at the origin of the scheduled flight. If not, then the battery pack may be designated as not available for the given flight and method 800 may restart for a new battery pack in the network.

If the battery pack is located at the origin location for the flight, then at step 804, a determination is made whether the battery pack's state of charge meets the flight's energy requirements. If not, then a determination may be made whether the battery pack is fully charged relative to the rated capacity (e.g., SOC equal to one) at step 806. If so, then the battery pack may be queued for another flight at step 808. If the battery pack does not have an SOC equal to one, then a determination may be made at step 810 whether the state of health of the battery pack is less than a predetermined retirement state of health. If it is below the retirement level, then the battery pack may be designated for retirement from the battery network at step 812. If the battery pack state of health is not below the retirement level, then the battery pack may be designated for charging (if not yet charging) or may be designated for continued charging (if already being charged) at step 814.

Returning to step 804, if the battery pack's state of charge meets the energy requirements for the flight, then a determination is made at step 816 whether the battery pack has a state of health that is higher than a previous battery pack evaluated in a previous loop of method 800. If it does not have a higher state of health, then the battery pack may be queued for another flight at step 808. If it does have a higher state of health, then the battery pack may be assigned to the flight at step 818, and if there is a battery pack that was previously assigned to the flight, then that battery pack may be moved to the queue for another flight. Method 800 may be applied to each battery pack in the network for each scheduled flight.

Figure 9:
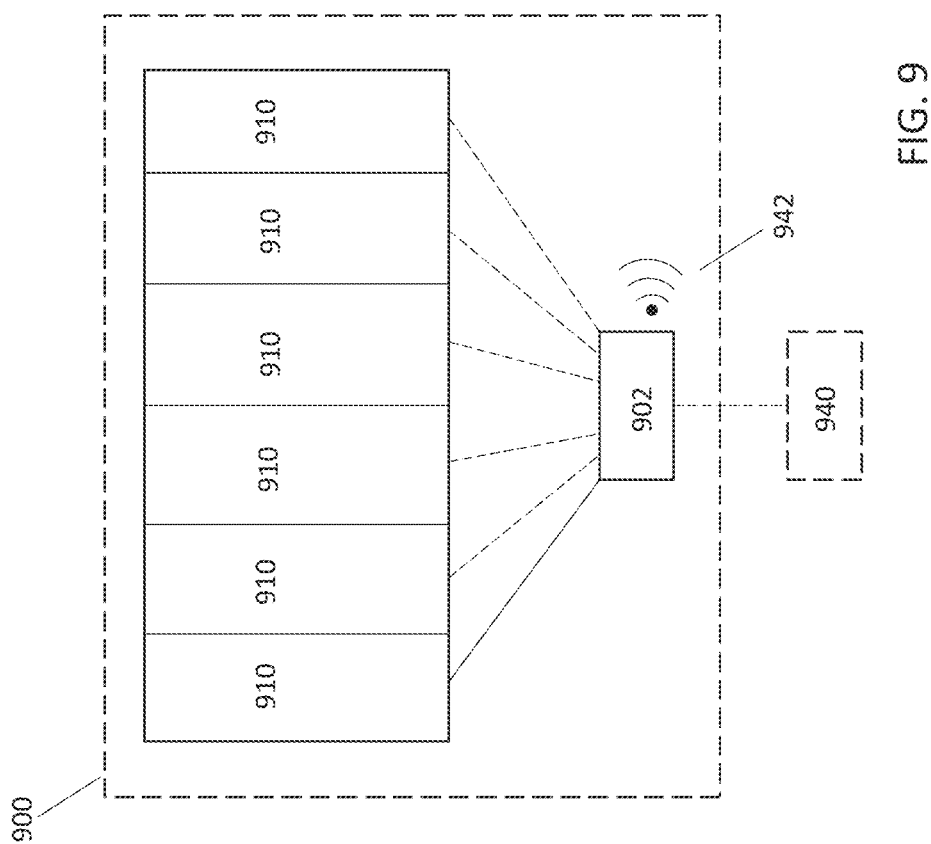
FIG. 9 illustrates an exemplary swappable battery pack that may be used according to any of the systems and methods described above.

FIG. 9 illustrates an exemplary swappable battery pack 900 that may be used according to any of the systems and methods described above, such as for battery pack 200 of FIG. 2, battery packs 402 of FIG. 4, and/or battery packs 502 of FIG. 5. Battery pack 900 includes a battery pack monitoring module 902 that may monitor the status of the battery pack 900 and may communicate the status to a connected system 940, such as a charger, via a wired connection, and/or to a remote system, such as via wireless communication 942. In some embodiments, the monitoring module 902 may wirelessly communicate status updates, such as to a local battery management system at a vertiport or to assignment system 510 via network 518. In some embodiments, monitoring module 902 may be configured for estimating the state of charge and/or state of health of the battery pack.

In some embodiments, battery pack 900 may include multiple different battery pack portions 910 that are electrically isolated from one another (such as for powering different EPUs of an aircraft—see, for example, battery pack 200 having battery pack portions 1-6 for powering different EPUs) and the monitoring module 902 may be configured for monitoring each battery pack portion 910. The illustrated embodiment includes six battery pack portions 910 and the monitoring module 902 is electrically connected to each battery pack portion 910 for monitoring the respective battery pack portion 910. In some embodiments, statuses for each battery pack portion may be provided by monitoring module 902 (e.g., for use by assignment system 510). For example, the states of charge and states of health for each battery pack portion 910 may be provided by monitoring module 902. In some embodiments, monitoring module 902 determines the state of charge and/or state of health as a combination (e.g., average) of the different battery pack portions 910.

The swappable battery packs can be located in any suitable locations of the aircraft, including in the fuselage and/or the wings. Swappable battery packs are generally configured to meet the energy draw requirements of the aircraft during flight to meet a desired maximum flight range. In some embodiments, an aircraft includes a single battery pack (that may have multiple battery pack portions that are electrically connected in serial or parallel or electrically isolated). The number and power of the EPUs for an aircraft can be selected according to the desired performance parameters (e.g., target payload, airspeed, and altitude) for the aircraft. According to various embodiments, the maximum power rating of one or more of the EPUs is 500 kilowatts or less, preferably 200 kilowatts or less, more preferably 150 kilowatts or less. According to some embodiments, the maximum power rating of one or more of the EPUs is at least 10 kilowatts, preferably at least 20 kilowatts, more preferably, at least 50 kilowatts. The aircraft can have an equal number of rotors and proprotors, a greater number of proprotors, or a greater number of rotors.

According to various embodiments, a swappable battery pack is configured so that its rated energy is at least 1 kilowatt-hour or preferably at least 10 kilowatt-hours, and/or its rated stored energy is at most 200 kilowatt-hours, preferably at most 100 kilowatt-hours, preferably at most 75 kilowatt-hours, or more preferably at most 50 kilowatt-hours. According to various embodiments, a swappable battery pack may be configured to provide a voltage of at least 100 volts, at least 500 volts, or at least 1000 volts at full charge. According to various embodiments, a swappable battery pack may be configured to provide at most 2000 volts, at most 1500 volts, at most 1000 volts, or at most 500 volts at full charge. According to some embodiments, nominal maximum voltage is between 500 and 1000 volts, preferably between 600 and 800 volts, or more preferably between 650 and 750 volts.

Aircraft according to the principles discussed above can be configured to carry at least one person and up to 10 people, preferably up to 6 people, and more preferably up to 4 people. According to some embodiments, the aircraft is configured to be piloted and includes piloting controls. In some embodiments, the aircraft is configured to operate autonomously without any onboard pilot and with or without one or more passengers.

According to some embodiments, the aircraft is configured to carry up to 6 people (for example, a pilot and up to 5 passengers) up to 75 miles at a cruising speed of up to 150 miles per hour at an altitude of up to 3,000 feet above ground. In some embodiments, the aircraft is configured for 5 people, such as one pilot and four passengers. According to various embodiments, the maximum range on a single battery pack full charge is 25 miles, 50 miles, 75 miles, 100 miles, or 200 miles.

Figure 10:
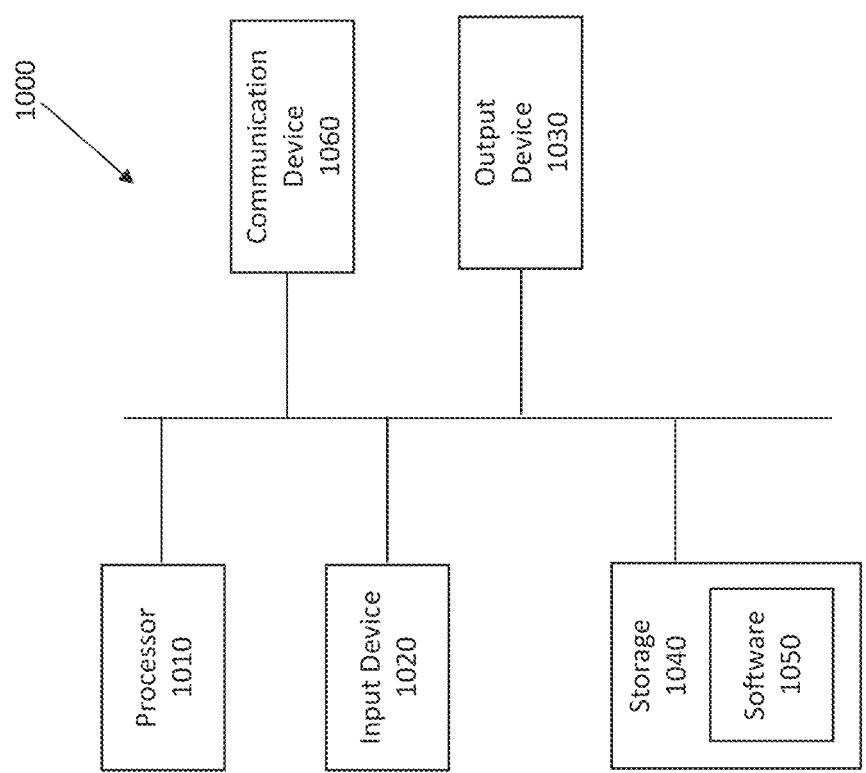
FIG. 10 illustrates an example of a computing system, according to various embodiments.

FIG. 10 illustrates an example of a computing system 1000, in accordance with some embodiments, that can be used for one or more of components of system 500 of FIG. 5, such as assignment system 510. System 1000 can be any suitable type of processor-based system. The system 1000 can include, for example, one or more of input device 1020, output device 1030, one or more processors 1010, storage 1040, and communication device 1060.

Input device 1020 can be any suitable device that enables user input, including an input device that is remotely located, such as at a client computing device connected to system 1000. Output device 1030 can be or include any suitable device that provides output, such as a display, touch screen, haptics device, virtual/augmented reality display, or speaker, and can include a remotely located output device.

Storage 1040 can be any suitable device that provides storage, such as an electrical, magnetic, or optical memory including a RAM, cache, hard drive, removable storage disk, or other non-transitory computer readable medium. Communication device 1060 can include any suitable device or combination of devices capable of transmitting and receiving signals from one or more other computing systems or modules. The components of the computing system 1000 can be connected in any suitable manner, such as via a physical bus or wirelessly.

Processor(s) 1010 can be any suitable processor or combination of processors, including any of, or any combination of, a central processing unit (CPU), graphics processing unit (GPU), field programmable gate array (FPGA), and application-specific integrated circuit (ASIC). Software 1050, which can be stored in storage 1040 and executed by one or more processors 1010, can include, for example, the programming that embodies the functionality or portions of the functionality of the present disclosure (e.g., as embodied in the devices as described above). For example, software 1050 can include one or more programs for execution by one or more processor(s) 1010 for performing one or more of the steps of the methods described herein, such as one or more steps of method 700 of FIG. 7 and/or method 800 of FIG. 8.

Software 1050 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 1040, that can contain or store programming for use by or in connection with an instruction execution system, apparatus, or device.

Software 1050 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate or transport programming for use by or in connection with an instruction execution system, apparatus, or device. The transport computer readable medium can include, but is not limited to, an electronic, magnetic, optical, electromagnetic, or infrared wired or wireless propagation medium. System 1000 can implement any suitable operating system and can be written in any suitable programming language.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

The invention claimed is:

1. A method for assigning swappable battery packs to electric aircraft, the method comprising:
    receiving, at a computing system, status information for a plurality of battery packs located at at least one battery swapping location, wherein the status information comprises states of charge and states of health for the plurality of battery packs;
    determining, by the computing system, energy requirements for a plurality of electric aircraft based at least in part on flight plans for the plurality of electric aircraft;
    determining, by the computing system, assignments of at least a portion of the plurality of battery packs to the plurality of electric aircraft based at least in part on the states of charge and states of health of the plurality of battery packs and the energy requirements for the plurality of aircraft; and
    swapping at least one battery pack into at least one aircraft based on the determined assignments.

2. The method of claim 1, wherein determining the assignments comprises assigning battery packs that have higher states of health to aircraft that have higher energy requirements.

3. The method of claim 1, wherein determining assignments comprises:
    identifying from among a plurality of the battery packs that are located at a first battery swapping location, multiple battery packs that have sufficient charge to meet energy requirements of a first aircraft that requires battery swapping at the first battery swapping location, and
    selecting, from among the multiple battery packs that have sufficient charge to meet energy requirements of the first aircraft, a first battery pack for assigning to the first aircraft based on maximizing battery cycle life of the plurality of battery packs.

4. The method of claim 1, wherein determining assignments comprises:
    identifying from among a plurality of the battery packs that are located at a first battery swapping location, multiple battery packs that have sufficient charge to meet energy requirements of a first aircraft that requires battery swapping at the first battery swapping location, and
    selecting, from among the multiple battery packs that have sufficient charge to meet energy requirements of the first aircraft, a first battery pack for assigning to the first aircraft based on the first battery pack having the highest state of health from among the multiple battery packs that have sufficient charge to meet energy requirements of the first aircraft.

5. The method of claim 1, wherein at least a portion of the status information for a respective battery pack is received via a network connection with the respective battery pack.

6. The method of claim 1, wherein at least a portion of the status information for a respective battery pack is received from a charging station connected to the respective battery pack.

7. The method of claim 1, wherein at least one of the battery packs of the plurality of battery packs comprises a plurality of battery pack portions that are electrically isolated from one another and the status of the first battery pack received at the computing system comprises a state of charge and a state of health for each of the battery pack portions.

8. The method of claim 1, wherein the assignments of at least a portion of the plurality of battery packs to the plurality of electric aircraft comprise assignments for battery packs and aircraft at multiple different battery swapping locations.

9. The method of claim 1, wherein the energy requirements for the plurality of electric aircraft is determined based on weather conditions.

10. The method of claim 1, wherein the aircraft is manned.

11. The method of claim 1, wherein the aircraft is a vertical take-off and landing aircraft.

12. A system for assigning swappable battery packs to electric aircraft, the system comprising one or more processors, memory, and one or more programs stored in the memory for execution by the one or more processors for:
    receiving status information for a plurality of battery packs located at at least one battery swapping location, wherein the status information comprises states of charge and states of health for the plurality of battery packs;
    determining energy requirements for a plurality of electric aircraft based at least in part on flight plans for the plurality of electric aircraft; and
    determining assignments of at least a portion of the plurality of battery packs to the plurality of electric aircraft based at least in part on the states of charge and states of health of the plurality of battery packs and the energy requirements for the plurality of aircraft.

13. The system of claim 12, wherein determining the assignments comprises assigning battery packs that have higher states of health to aircraft that have higher energy requirements.

14. The system of claim 12, wherein determining assignments comprises:
    identifying from among a plurality of the battery packs that are located at a first battery swapping location, multiple battery packs that can meet energy requirements of a first aircraft that requires battery swapping at the first battery swapping location, and selecting, from among the multiple battery packs that can meet energy requirements of the first aircraft, a first battery pack for assigning to the first aircraft based on maximizing battery cycle life of the plurality of battery packs.

15. The system of claim 12, wherein determining assignments comprises:

identifying from among a plurality of the battery packs that are located at a first battery swapping location, multiple battery packs that are fully charged and can meet energy requirements of a first aircraft that requires battery swapping at the first battery swapping location, and selecting, from among the multiple battery packs that can meet energy requirements of the first aircraft, a first battery pack for assigning to the first aircraft based on the first battery pack comprises the highest state of health from among the multiple battery packs that can meet energy requirements of the first aircraft.

16. The system of claim 12, wherein at least a portion of the status information for a respective battery pack is received via a network connection with the respective battery pack.

17. The system of claim 12, wherein at least a portion of the status information for a respective battery pack is received from a charging station connected to the respective battery pack.

18. The system of claim 12, wherein the statuses comprise temperatures of the plurality of batteries.

19. The system of claim 12, wherein at least one of the battery packs of the plurality of battery packs comprises a plurality of battery pack portions that are electrically isolated from one another and the status of the first battery pack received at the computing system comprises a state of charge and a state of health for each of the battery pack portions.

20. The system of claim 12, wherein the assignments of at least a portion of the plurality of battery packs to the plurality of electric aircraft comprise assignments for battery packs and aircraft at multiple different battery swapping locations.

* * * * *